United States Patent [19]
Lee

[11] Patent Number: 6,043,154
[45] Date of Patent: *Mar. 28, 2000

[54] METHOD FOR MANUFACTURING CHARGE STORAGE ELECTRODE

[75] Inventor: Tong-Hsin Lee, Taipei Hsien, Taiwan

[73] Assignee: United Silicon Incorporated, Hsinchu City, Taiwan

[*] Notice: This patent is subject to a terminal disclaimer.

[21] Appl. No.: 09/057,599

[22] Filed: Apr. 8, 1998

[30] Foreign Application Priority Data

Dec. 6, 1997 [TW] Taiwan ................... 86118376

[51] Int. Cl.$^7$ ............................... H01L 21/8242
[52] U.S. Cl. ................... 438/689; 438/704; 438/745; 438/753
[58] Field of Search ................... 438/689, 699, 438/704, 398, 399, 690, 691, 725

[56] References Cited

U.S. PATENT DOCUMENTS

| | | | |
|---|---|---|---|
| 5,618,747 | 4/1997 | Lou | 438/398 |
| 5,722,442 | 3/1998 | Hoffman et al. | 134/102.1 |
| 5,770,095 | 6/1998 | Sasaki et al. | 216/38 |
| 5,869,387 | 2/1999 | Sato et al. | 438/459 |
| 5,932,333 | 8/1999 | Lee | 428/255 |

*Primary Examiner*—Benjamin L. Utech
*Assistant Examiner*—Lan Vinh
*Attorney, Agent, or Firm*—Thomas, Kayden, Horstemeyer & Risley

[57] ABSTRACT

A method for manufacturing a charge storage electrode that utilizes the tendency for implanted phosphorus ions in a hemispherical grain (HSG) polysilicon layer to gather near the grooves so that the rate of oxidation there increases. Utilizing this property, a solution including an oxidizing agent and an etching agent mixed in a specified ratio is employed to etch the hemispherical grained polysilicon layer so that the grooves in the hemispherical polysilicon layer is deepened. Therefore, the surface area of the charge storage electrode is increased, and hence capacitance of the charge storage structure becomes greater. Moreover, the method used in this invention is compatible with the conventional processes and can be produced in batches. Therefore, production cost is low.

20 Claims, 2 Drawing Sheets

METHOD FOR MANUFACTURING CHARGE STORAGE ELECTRODE

CROSS-REFERENCE TO RELATED APPLICATION

This application claims priority benefit of Taiwan application Serial no. 86118376, filed Dec. 6, 1997, the full disclosure of which is incorporated herein by reference.

BACKGROUND OF THE INVENTION

1. Field of Invention

The present invention relates to a method for manufacturing a charge storage electrode. More particularly, the present invention relates to a method for manufacturing the charge storage electrode of a capacitor in high density DRAM.

2. Description of Related Art

DRAMs use an array of capacitors fabricated on a semiconductor substrate to store digital data. In general, the charge storage states are utilized to store a bit of data. Normally, a capacitor with charges is regarded as in a logic "1" state, and a capacitor without stored charges is regarded as in a logic "0" state. Hence, a single bit of binary data is stored in a capacitor. The charge storage capacity of a capacitor depends on several factors including surface area within the electrode of a capacitor, the reliability of the electrode isolation and the dielectric constant of the dielectric layer between the electrodes of a capacitor. Storage and retrieval of data to and from memory as well as reading and writing operations are executed by the transfer of charges to or from the capacitor through a transfer field effect transistor (FET), which is coupled to a bit line. The bit line is connected to one source/drain terminal of the transfer FET, while the charge storage capacitor is connected to the other source/drain terminal of the transfer FET. A word line is connected to the gate of the transfer FET. Control signals can then be sent through the word line to the gate of the transfer FET, thereby switching open the transistor. Hence, an electrical connection between one electrode of the capacitor and the bit line is established, and the transfer of charges to and from the capacitor is allowed.

To increase data storage capacity of memory in a single chip, one method is to increase its density. High-density memory not only can provide a compact structural design on a wafer, but can also save production cost. In general, the density of an integrated circuit device can be increased by reducing the wiring lines, the dimensions of a transistor gate or area occupation of a device isolation region. However, the reduction in dimensions for some circuit elements is always limited by some newly established set of design rules because of miniaturization.

Following the set of design rules for producing a conventional miniaturized planar capacitor, the quantity of charges capable of being stored in a capacitor is greatly reduced. When the charge storage capacity of a capacitor is reduced, a number of problems will arise. For example, since a greater proportion of charges will be lost per unit time, potential drops quickly leading to a deterioration of memory function. Consequently, refresh cycles for DRAMs have to be performed more frequently. Since no data storage or retrieval can be done during these refresh cycles, frequent refreshes represents additional operational overhead. In addition, a reduction of charge storage capacity in a capacitor will result in a drop in potential. A low potential requires a rather complicated data processing design and a highly sensitive charge sense amplifier for reading out the charge from the capacitor. Therefore, complicated capacitor structures having large three dimensional charge storage surface must be designed in order to increase the capacitance as well as to fit them within the limited DRAM substrate surface caused by device miniaturization. However, forming these highly complicated capacitor structures is difficult, especially when quality and throughput are also required.

Forming hemispherical grained polysilicon (HSG-Si) layer over the charge-storage electrode surface of a DRAM capacitor is a widely adopted method for increasing capacitance nowadays. Conventionally, DRAM capacitors are formed by forming two polysilicon electrodes with a dielectric layer sandwiched in the middle. When the polysilicon electrodes are planarized in a conventional method, their surfaces are usually smooth. Hemispherical grained polysilicon is a special form of polysilicon having a rough surface. When the HSG-Si is deposited over the electrode under careful control, charge storage capacity of a DRAM capacitor can increase up to about 1.8 times.

To increase surface area of a capacitor even further, pillar-shaped or fin-shaped structures can be formed over the semiconductor base first before the deposition of HSG. However, fabricating pillar-shaped or fin-shaped involved complicated processing steps, which not only will lower the rate of production, but will also incur more cost as well.

In light of the foregoing, there is a need to improve the method of forming the lower electrode of a semiconductor capacitor.

SUMMARY OF THE INVENTION

Accordingly, the present invention is to provide a method for manufacturing the storage electrode of a capacitor such that a lower electrode having a larger surface area can be obtained through the efficient use of HSG-Si layer. Optimum surface area for the HSG-Si layer is obtained through oxidizing-etching reactions.

To achieve these and other advantages and in accordance with the purpose of the invention, as embodied and broadly described herein, the invention provides a method for manufacturing a charge storage electrode having a larger surface area. The electrode is suitable for forming over a device having a MOS transistor base. The method comprises the steps of forming a hemispherical grained polysilicon layer over the MOS transistor base, and then driving phosphorus ions into the polysilicon layer. Next, photolithographic and etching processes are used to pattern the hemispherical grained polysilicon layer. Since phosphorus ions will tend to concentrate around the groove area of the hemispherical grain, oxidation rate at the grain boundaries near the groove area will increase. Utilizing this property, an oxidation/etching reactive solution mixed in a specified ratio is used to oxidize and etch the hemispherical grained polysilicon layer. Consequently, the treated hemispherical grained polysilicon layer over the lower electrode will have a larger surface area, and hence the capacitance of the charge storage structure is increased. Moreover, the method used in this invention is compatible with the conventional processes and can be produced in batches, production cost is therefore lower.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
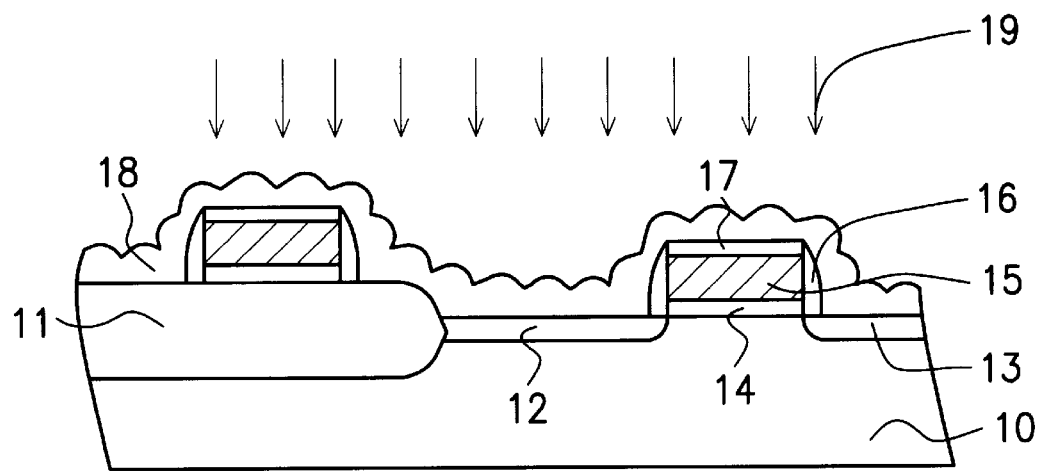
FIGS. 1A through 1D are cross-sectional views showing the progression of manufacturing steps in producing a charge storage structure according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1D are cross-sectional views showing the progression of manufacturing steps in producing a charge storage structure according to one preferred embodiment of this invention.

First, as shown in FIG. 1A, a MOS transistor base is provided. The MOS transistor base includes a substrate 10, a device isolation structure 11, source/drain regions 12 and 13, a gate oxide layer 14, a gate 15, spacers 16 and an oxide layer 17. Thereafter, a hemispherical grained polysilicon (HSG-Si) layer 18 is formed over the MOS transistor base. The hemispherical grained layer 18 can be formed by any conventional method. For example, using silane as the gaseous source, a low-pressure vapor deposition method can be used to deposit HSG-Si at a controlled reacting temperature of about 550° C. to 595° C. Finally, through a nucleation process of the HSG-Si, irregular hemispherical grain surface is obtained. In a subsequent step, a thermal diffusion or ion implantation method can be used to drive in impurity ions, for example, phosphorus ions 19, into the hemispherical grained polysilicon layer 18.

Figure 1B:
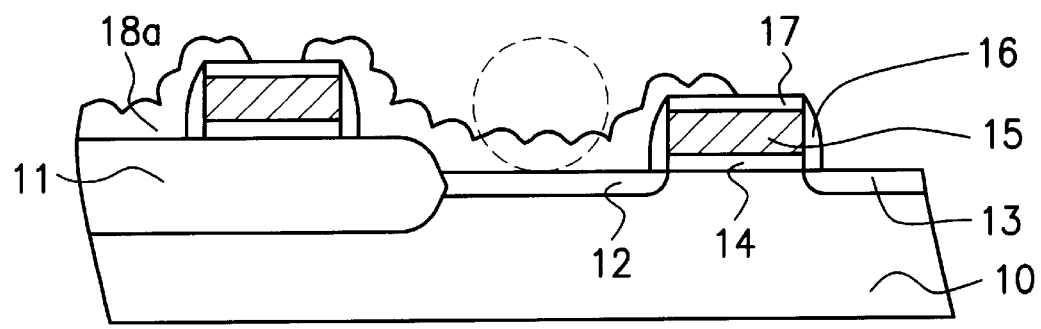

Next, as shown in FIG. 1B, photolithographic and etching processes are used to pattern the hemispherical grained polysilicon layer 18 forming a hemispherical grained polysilicon layer 18a. Although the hemispherical grained polysilicon layer 18a already has a hemispherical grained surface, the surface area provided is still quite limited.

Figure 2:
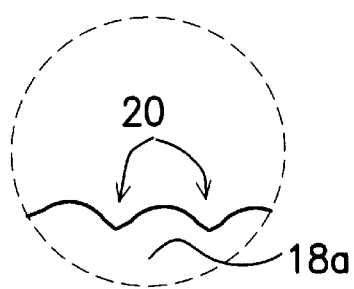
FIG. 2 is a magnified view of the portion enclosed within the dashed circle in FIG. 1B.

FIG. 2 is a magnified view of the portion enclosed within the dashed circle in FIG. 1B. In FIG. 2, surface area provided by the hemispherical grained polysilicon layer 18a is indicated.

Figure 1C:
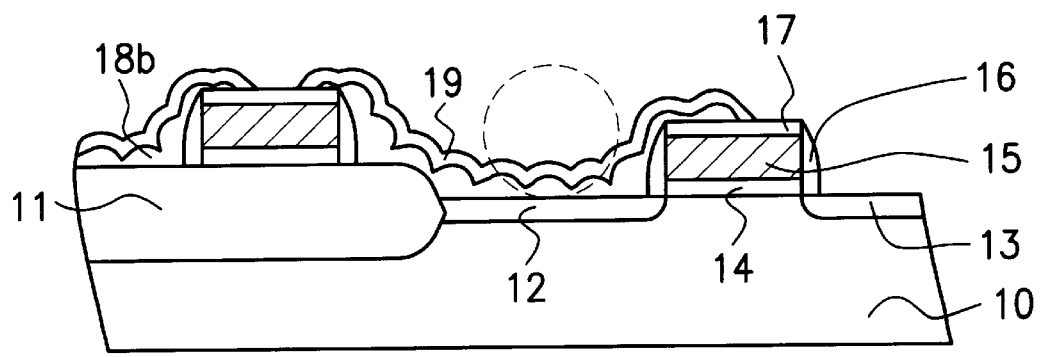

Next, as shown in FIG. 1C, since the phosphorus in the phosphorus doped hemispherical grained polysilicon layer 18a will tend to migrate towards groove portions 20 of the hemispherical grain, oxidizing rate at the grain boundary near the groove area will increase. Therefore, a diluted solution of an oxidizing agent and an etching agent mixed in an appropriate ratio is formed and then applied to oxidize and etch the HSG layer. The oxidizing agent can enable a faster growth of oxide layer near the groove portions 20 of the hemispherical grains, while the etching agent can continuously etch away the oxide layer. Through repetitive cycles of oxidizing and etching operations, grooves 20a in the hemispherical grained polysilicon layer 18b are deepened, while the thickness of the hemispherical grained polysilicon layer 18b is reduced. Hence, surface area of the hemispherical grained polysilicon layer 18b, which serves as the lower electrode of the charge storage structure, increases. The oxidizing agent can be hydrogen peroxide. The etching agent can be liquid ammonia. Oxidation-etching reaction can be carried out at a temperature of about 60° C. to 200° C. using a solution of oxidizing agent/etching agent mixed in a ratio between 1:50 to 1:100 for about 120 to 180 minutes.

Figure 3:
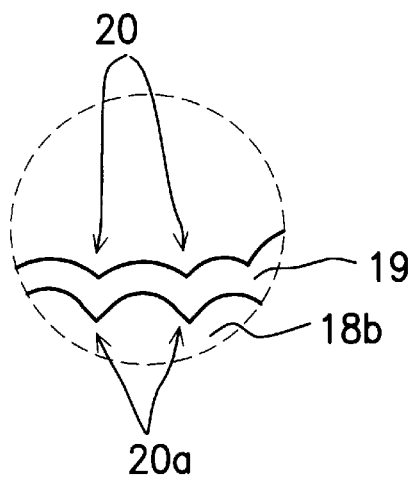
FIG. 3 is a magnified view of the portion enclosed within the dashed circle in FIG. 1C.

FIG. 3 is a magnified view of the portion enclosed within the dashed circle in FIG. 1C. In FIG. 3, surface area of the hemispherical grained polysilicon layer 18b after the oxidation/etching reaction of the hemispherical grained polysilicon layer 18a is indicated.

Figure 1D:
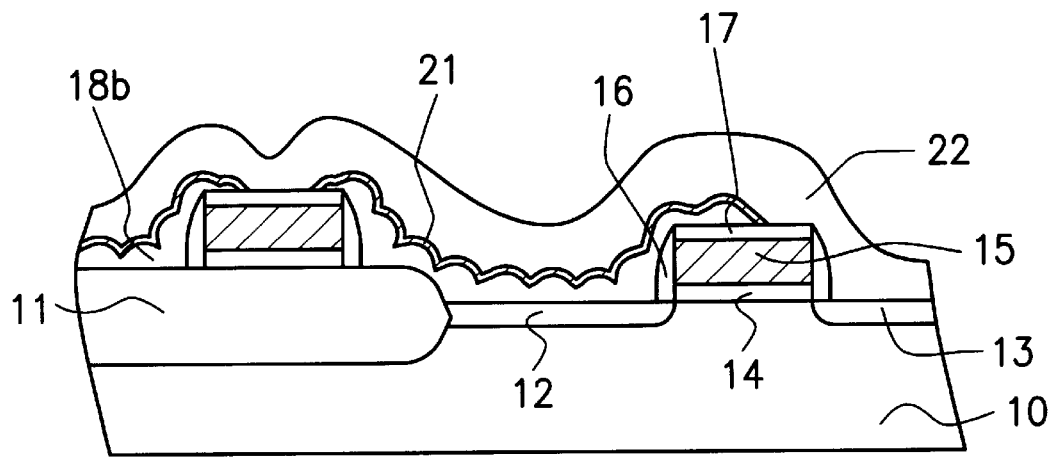

Thereafter, as shown in FIG. 1D, a thin dielectric layer 21 is formed over the hemispherical grained polysilicon layer 18b. Then, a conductive layer 22, which serves as the upper electrode of the charge storage structure, is formed over the dielectric layer 21. The dielectric layer 21 can be, for example, an oxide/nitride/oxide (ONO) composite layer, a nitride/oxide (NO) composite layer, or even a high dielectric constant tantalum pentoxide ($Ta_2O_5$) layer. Before the deposition of the dielectric layer, any native oxide must be removed first. Native oxide can be removed, for example, by a wet etching method using hydrofluoric acid solution. The conductive layer 22 can be a phosphorus doped polysilicon layer formed at a temperature of about 620° C. The conductive layer 22 preferably has a thickness of about 2000 Å, and the phosphorus doping is conducted at a temperature of around 880° C. Alternatively, the conductive layer 22 can be a titanium nitride layer.

In this preferred embodiment, a hemispherical grained polysilicon layer is used as the lower electrode. Alternatively, pillar-shaped or fin-shaped structures can be formed over the MOS transistor base to increase the surface area of the lower electrode first, and then a layer of hemispherical grained polysilicon is formed over the pillar or fin-shaped structures. Thereafter, subsequent processing operations according to this invention are carried out to further increase the surface area of the lower electrode.

As a summary, this invention utilizes the tendency of implanted phosphorus ions in a hemispherical grain polysilicon layer to gather near the grooves, thereby increasing the oxidation rate there. Utilizing this property, a solution including an oxidizing agent and an etching agent mixed in a specified ratio is employed to oxidize and etch the hemispherical grained polysilicon layer so that the grooves in the hemispherical polysilicon layer is deepened, thereby increasing its surface area. Through increasing the surface area of the charge storage electrode, capacitance of the charge storage structure is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a charge storage structure over a substrate having a semiconductor device formed thereon, comprising the steps of:

forming a hemispherical grained polysilicon layer over the semiconductor device and the substrate and then patterning the hemispherical grained polysilicon layer, wherein the hemispherical grained polysilicon layer is doped with impurity ions, and the impurity ions have a greater concentration at a groove portion of the hemispherical grained polysilicon layer; and immersing the substrate in a solution comprising an oxidizing agent and an etching agent such that two reactions between the solution and the hemispherical grained polysilicon layer are produced, including:

oxidizing the hemispherical grained polysilicon layer by the oxidizing agent in the solution to form an oxide layer on the hemispherical grained polysilicon surface; and etching to remove the oxidized layer by the etching agent in the solution, wherein the above two reactions takes place in tandem.

2. The method of claim 1, wherein the step of impurity doping includes doping phosphorus ions.

3. The method of claim 1, wherein the step of oxidation by an oxidizing agent includes using hydrogen peroxide.

4. The method of claim 1, wherein the step of etching by an etching agent includes using liquid ammonia.

5. The method of claim 1, wherein the step of forming the solution for oxidation and etch-removal includes mixing the oxidizing agent and the etching agent in a ratio between 1:50 to 1:100.

6. The method of claim 1, wherein the step of oxidation and etch-removal is carried out at a temperature controlled roughly between 60° C. to 200° C. for about 120 to 180 minutes.

7. A method for manufacturing a charge storage structure over a substrate having a semiconductor device formed thereon, comprising the steps of:

forming a hemispherical grained polysilicon layer over the semiconductor device and the substrate, then patterning the hemispherical grained polysilicon layer, wherein the hemispherical grained polysilicon layer is doped with impurity ions, and the impurity ions have a greater concentration at a groove portion of the hemispherical grained polysilicon layer; and immersing the substrate in a solution comprising hydrogen peroxide and liquid ammonia such that two reactions between the solution and the hemispherical grained polysilicon layer are produced, including:

oxidizing the hemispherical grained polysilicon layer by the hydrogen peroxide in the solution to form an oxide layer on the hemispherical grained polysilicon surface; and etching to remove the oxidized layer by the liquid ammonia in the solution, wherein the above two reactions takes place in tandem.

8. The method of claim 7, wherein the step of impurity doping includes doping phosphorus ions.

9. The method of claim 7, wherein the step of forming the solution for oxidation and etch-removal includes mixing the hydrogen peroxide and the liquid ammonia in a ratio between 1:50 to 1:100.

10. The method of claim 7, wherein the step of oxidation and etch-removal is carried out at a temperature controlled roughly between 60° C. to 200° C. for about 120 to 180 minutes.

11. A method for manufacturing a charge storage structure over a substrate having a semiconductor device formed thereon, comprising the steps of:

forming a polysilicon layer structure over the substrate;

forming a hemispherical grained polysilicon layer over the polysilicon layer structure, and then patterning the hemispherical grained polysilicon layer, wherein the hemispherical grained polysilicon layer is doped with impurity ions, and the impurity ions have a greater concentration at a groove portion of the hemispherical grained polysilicon layer;

immersing the substrate in a solution comprising an oxidizing agent and an etching agent such that two reactions between the solution and the hemispherical grained polysilicon layer are produced, including:

oxidizing the hemispherical grained polysilicon layer by the oxidizing agent in the solution to form an oxide layer on the hemispherical grained polysilicon surface; and etching to remove the oxidized layer by the etching agent in the solution, wherein the above two reactions takes place in tandem.

12. The method of claim 11, wherein the step of impurity doping includes doping phosphorus ions.

13. The method of claim 11, wherein step of oxidation by an oxidizing agent includes using hydrogen peroxide.

14. The method of claim 11, wherein the step of etching by an etching agent includes using liquid ammonia.

15. The method of claim 11, wherein the step of forming the solution for oxidation and etch-removal includes mixing the oxidizing agent and the etching agent in a ratio between 1:50 to 1:100.

16. The method of claim 11, wherein the step of oxidation and etch-removal is carried out at a temperature controlled roughly between 60° C. to 200° C. for about 120 to 180 minutes.

17. A method for manufacturing a charge storage structure over a substrate having a semiconductor device formed thereon, comprising the steps of:

forming a polysilicon layer structure over the substrate;

forming a hemispherical grained polysilicon layer over the polysilicon layer structure, and then patterning the hemispherical grained polysilicon layer, wherein the hemispherical grained polysilicon layer is doped with impurity ions, and the impurity ions have a greater concentration at a groove portion of the hemispherical grained polysilicon layer;

immersing the substrate in a solution comprising hydrogen peroxide and liquid ammonia such that two reactions between the solution and the hemispherical grained polysilicon layer are produced, including:

oxidizing the hemispherical grained polysilicon layer by the hydrogen peroxide in the solution to form an oxide layer on the hemispherical grained polysilicon surface; and etching to remove the oxidized layer by the liquid ammonia in the solution, wherein the above two reactions takes place in tandem.

18. The method of claim 17, wherein the step of impurity doping includes doping phosphorus ions.

19. The method of claim 17, wherein the step of forming the solution for oxidation and etch-removal includes mixing the hydrogen peroxide and the liquid ammonia in a ratio between 1:50 to 1:100.

20. The method of claim 17, wherein the step of oxidation and etch-removal is carried out at a temperature controlled roughly between 60° C. to 200° C. for about 120 to 180 minutes.

* * * * *